United States Patent
Kamioka et al.

(10) Patent No.: US 12,449,461 B2
(45) Date of Patent: Oct. 21, 2025

(54) CHARGE SENSOR

(71) Applicant: Mitsubishi Electric Corporation, Tokyo (JP)

(72) Inventors: Jun Kamioka, Tokyo (JP); Koji Yamanaka, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 225 days.

(21) Appl. No.: 18/372,416

(22) Filed: Sep. 25, 2023

(65) Prior Publication Data
US 2024/0012041 A1 Jan. 11, 2024

Related U.S. Application Data

(63) Continuation of application No. PCT/JP2021/020318, filed on May 28, 2021.

(51) Int. Cl.
G01R 29/24 (2006.01)
H03F 1/56 (2006.01)
H03H 7/40 (2006.01)

(52) U.S. Cl.
CPC .......... *G01R 29/24* (2013.01); *H03F 1/565* (2013.01); *H03H 7/40* (2013.01)

(58) Field of Classification Search
CPC .......... G01R 29/24; H03H 7/38; H03H 7/40
USPC .......... 348/218.1; 333/17.3; 257/212, 215
See application file for complete search history.

(56) References Cited

U.S. PATENT DOCUMENTS

| | | | |
|---|---|---|---|
| 5,561,300 A | 10/1996 | Wada et al. | |
| 5,694,059 A | 12/1997 | Wada et al. | |
| 11,892,473 B2* | 2/2024 | Goossens | G01R 15/16 |
| 2024/0183892 A1* | 6/2024 | Cohen | G01R 29/24 |

FOREIGN PATENT DOCUMENTS

| | | |
|---|---|---|
| JP | 7-221322 A | 8/1995 |
| JP | 2008-294485 A | 12/2008 |
| JP | 2010-181202 A | 8/2010 |

OTHER PUBLICATIONS

International Search Report (PCT/ISA/210) issued in PCT/JP2021/020318, dated Aug. 17, 2021.

\* cited by examiner

*Primary Examiner* — Hai L Nguyen
(74) *Attorney, Agent, or Firm* — Birch, Stewart, Kolasch & Birch, LLP

(57) ABSTRACT

A charge sensor according to the present disclosed technology includes a quantum dot to have a first end connected to an input terminal via a first tunnel junction and a second end connected to an output terminal via a second tunnel junction, and an inductor connected in parallel to the quantum dot.

4 Claims, 4 Drawing Sheets

CHARGE SENSOR

CROSS REFERENCE TO RELATED APPLICATIONS

This application is a Continuation of PCT International Application No. PCT/JP2021/020318, filed on May 28, 2021, which is hereby expressly incorporated by reference into the present application.

TECHNICAL FIELD

The present disclosed technology relates to a charge sensor.

BACKGROUND ART

A quantum-gate quantum computer uses quantum bits represented by a state vector of a quantum mechanical two-level system. Examples of the quantum bit include an electron-spin quantum bit using the direction of an electron spin.

For example, it is conceivable to implement the electron-spin quantum bit by confining one electron in a quantum dot (hereinafter, referred to as "silicon quantum dot") made of minute silicon, and manipulating and reading the spin of the confined electron. In order to read the quantum state of the electron-spin quantum bit, it is necessary to have a technique of sensing a change in the minute amount of charge flowing through the silicon quantum dot with high sensitivity. Conventionally, the method of measuring a current value by connecting an input terminal and an output terminal to the silicon quantum dot has been attempted to sense the minute amount of charge.

In general, if the number of electrons in the silicon quantum dot is small, the current value is small, and measurement is difficult. As the method of measuring the minute amount of charge, a method is conceivable in which another silicon quantum dot used as a charge sensor is disposed in the vicinity of the silicon quantum dot and these dots are capacitively coupled.

Furthermore, as the method of measuring the minute amount of charge, a method of obtaining the amount of charge by inputting a high-frequency signal to a charge sensor and measuring a reflection characteristic is also conceivable. For example, Patent Literature 1 discloses that a high-frequency signal with a resonance frequency is input to an input terminal, and the time dependence of charge in a minute conduction region is measured by the transmission characteristic of the high-frequency signal output from an output terminal. The method using the high-frequency signal is certainly more sensitive than the method of measuring the current value.

CITATION LIST

Patent Literatures

Patent Literature 1: JP 2008-294485 A

SUMMARY OF INVENTION

Technical Problem

However, conventional methods using high-frequency signals are still not sensitive enough. An object of the charge sensor according to the present disclosed technology is to solve the problem that the sensitivity is still insufficient, and to provide a structure and a measurement method of improving the sensitivity of a charge sensor using quantum dots.

Solution to Problem

A charge sensor according to the present disclosed technology includes a quantum dot to have a first end connected to an input terminal via a first tunnel junction and a second end connected to an output terminal via a second tunnel junction, and an inductor to be connected in parallel to the quantum dot.

Advantageous Effects of Invention

Since the charge sensor according to the present disclosed technology has the configuration described above, it is possible to obtain an operation that the reflection amplitude, reflection phase, passing amplitude, and passing phase sharply change with respect to a change in the capacitance value of the quantum dot. With this operation, the charge sensor according to the present disclosed technology has an effect of improving the sensitivity of sensing.

DESCRIPTION OF EMBODIMENTS

First Embodiment

Figure 1:
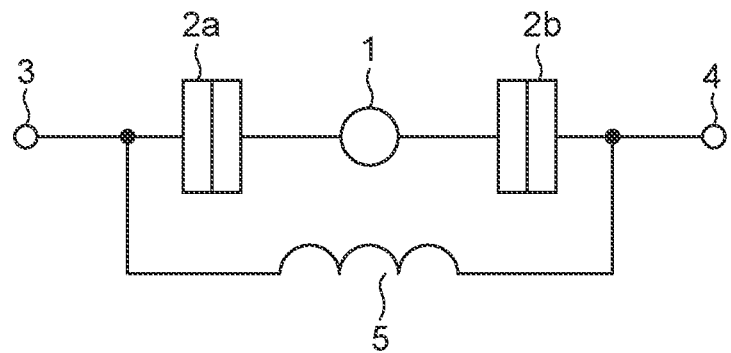
FIG. 1 is a circuit diagram illustrating a configuration of a charge sensor according to a first embodiment.

FIG. 1 is a circuit diagram illustrating a configuration of a charge sensor according to a first embodiment. As illustrated in FIG. 1, the charge sensor according to the first embodiment includes a quantum dot 1, a tunnel junction 2$a$, a tunnel junction 2$b$, an input terminal 3, an output terminal 4, and an inductor 5.

The quantum dot 1 may be, for example, a silicon quantum dot physically formed on an SOI substrate.

One end of the quantum dot 1 is connected to the input terminal 3 via the first tunnel junction 2$a$. The other end of the quantum dot 1 is connected to the output terminal 4 via the second tunnel junction 2$b$. The inductor 5 and the quantum dot 1 are connected in parallel.

The charge sensor with the configuration of FIG. 1 may be, for example, a quantum dot device formed on a silicon on insulator (SOI).

Figure 2:
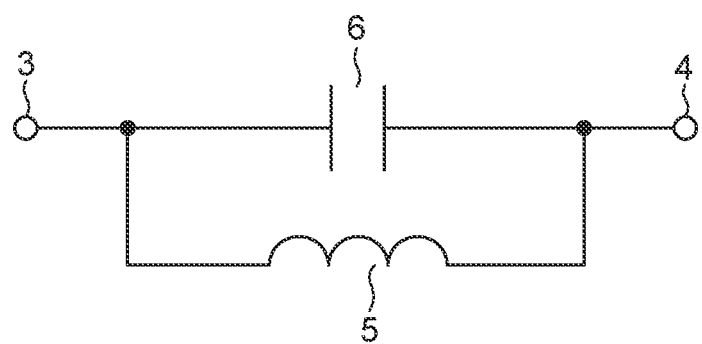
FIG. 2 is an equivalent circuit of the charge sensor according to the first embodiment, provided that a quantum dot 1 is in an off state.
Figure 3:
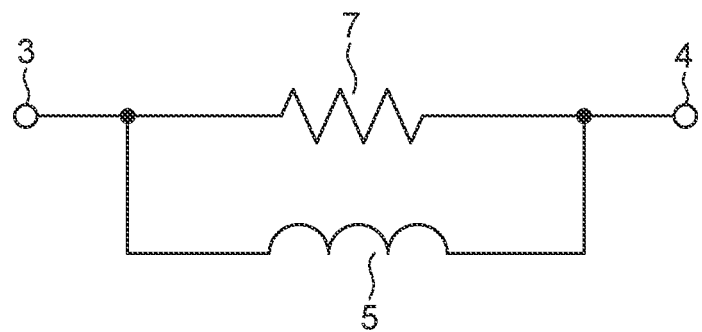
FIG. 3 is an equivalent circuit of the charge sensor according to the first embodiment, provided that the quantum dot 1 is in an on state.

The quantum dot 1 of the charge sensor according to the first embodiment transitions to an off state or an on state by a surrounding electric field. FIG. 2 is an equivalent circuit of the charge sensor according to the first embodiment, provided that the quantum dot 1 is in the off state. FIG. 3 is an equivalent circuit of the charge sensor according to the first embodiment, provided that the quantum dot 1 is in the on state.

As illustrated in FIG. 2, when the quantum dot 1 is in the off state, tare quantum dot 1, the tunnel junction 2*a*, and the tunnel junction 2*b* can be regarded as an equivalent off-capacitance 6, Therefore, the entire circuit can be regarded as an LC parallel circuit including the inductor 5 and the equivalent off-capacitance 6. A transfer function ($F_{OFF}$) from the input terminal 3 to the output terminal 4 in this case is represented by the following Formula (1).

$$F_{OFF}(s) = \frac{Z_2(s)}{Z_{1\_OFF}(s) + Z_2(s)} \qquad (1)$$

wherein $$Z_{1\_OFF}(s) = \frac{\frac{1}{sC} sL}{\frac{1}{sC} + sL} \ldots \text{Combined impedance of parallel } LC$$

$Z_2(s)$: Impedance between output terminal 4 and GND

As illustrated in FIG. 3, when the quantum dot 1 is in the on state, the quantum dot 1, the tunnel junction 2*a*, and the tunnel junction 2*b* can be regarded as an equivalent on-resistor 7. Therefore, the entire circuit can be regarded as an RL parallel circuit including the inductor 5 and the equivalent on-resistor 7. A transfer function ($F_{ON}$) from the input terminal 3 to the output terminal 4 in this case is represented by the following Formula (2).

$$F_{ON}(s) = \frac{Z_2(s)}{Z_{1\_ON}(s) + Z_2(s)} \qquad (2)$$

wherein $$Z_{1\_ON}(s) = \frac{sLR}{R + sL} \ldots \text{Combined impedance of parallel } RL$$

$Z_2(s)$: Impedance between output terminal 4 and GND

A high-frequency signal is input to the input terminal 3. A part of the high-frequency signal is output to the output terminal 4. The remaining high-frequency signal is reflected and returned to the input terminal 3. The quantum dot 1 of the charge sensor changes its characteristics sensitively to a change in a nearby electric field due to its feature, and is switched between the on state and the off state. The state of the quantum dot 1 can be grasped by measuring the amplitude and phase (hereinafter, referred to as "reflection amplitude" and "reflection phase") of a reflected signal of the high-frequency signal and the amplitude and phase (hereinafter, referred to as "passing amplitude" and "passing phase") of a passing signal of the high-frequency signal. That is, the change in the nearby electric field can be sensed by measuring the reflection amplitude, the reflection phase, the passing amplitude, and the passing phase.

In the charge sensor according to the present disclosed technology, the inductance value of the inductor 5 may be determined by the frequency of an input high-frequency signal. From Formula (1), a combined impedance ($Z_{1\_OFF}$) between the input terminal 3 and the output terminal 4, when the quantum dot 1 is in the off state, can be deformed as follows.

$$Z_{1\_OFF}(s) = \frac{sL}{1 + s^2 CL} \qquad (3)$$

Substitute $s = j\omega$ $$Z_{1\_OFF}(j\omega) = \frac{j\omega L}{1 - \omega^2 CL}$$

That is, when an angular frequency $\omega$ of a signal input to the circuit is $\omega_0$ represented by the following Formula (4), the denominator of Formula (3) is 0.

$$\omega_0 = \sqrt{\frac{1}{CL}} \qquad (4)$$

$$f_0 = \frac{\omega_0}{2\pi} = \frac{1}{2\pi}\sqrt{\frac{1}{CL}}$$

Here, $\omega_0$ is called a resonance angular frequency, and $f_0$ is called a resonance frequency. Specifically, the inductance value of the inductor 5 may be determined by performing a back calculation using Formula (4) in such a manner that the resonance frequency ($f_0$) corresponds to the frequency of the input high-frequency signal.

By determining the inductance value of the inductor 5 as described above, the combined impedance ($Z_{1\_OFF}$) between the input terminal 3 and the output terminal 4 is infinite when the quantum dot 1 is in the off state. In other words, when the quantum dot 1 is in the off state, the circuit between the input terminal 3 and the output terminal 4 is open, and the high-frequency signal is totally reflected.

On the other hand, a combined impedance ($Z_{1\_ON}$) between the input terminal 3 and the output terminal 4 when the quantum dot 1 is in the on state is given by the following Formula (5).

$$Z_{1\_ON}(s) = \frac{sLR}{R + sL} \qquad (5)$$

Substitute $s = j\omega$ $$Z_{1\_ON}(j\omega) = \frac{j\omega LR}{R + j\omega L}$$

As shown by Formula (5), when the quantum dot 1 is in the on state, the combined impedance ($Z_{1\_ON}$) between the input terminal 3 and the output terminal 4 has a real-part component R in the denominator, and thus the denominator does not become 0 regardless of the frequency of the signal input to the circuit.

The effect of the charge sensor according to the present disclosed technology will be apparent by comparing with the circuit characteristics according to the conventional technique without the inductor 5. In the conventional technique without the inductor 5, the combined impedance between the input terminal 3 and the output terminal 4 in the off state and the on state of the quantum dot 1 is as follows.

$$Z_{1\_OFF\_Trad}(j\omega) = \frac{1}{j\omega C} \qquad (6)$$

-continued $$Z_{1\_ON\_Trad}(j\omega) = R$$

As shown by Formula (6), in the conventional technique, the denominator of the formula of the combined impedance is not 0 when the quantum dot 1 is in the off state. That is, the phenomenon that the high-frequency signal is totally reflected due to the open circuit between the input terminal 3 and the output terminal 4 does not occur.

Figure 4:
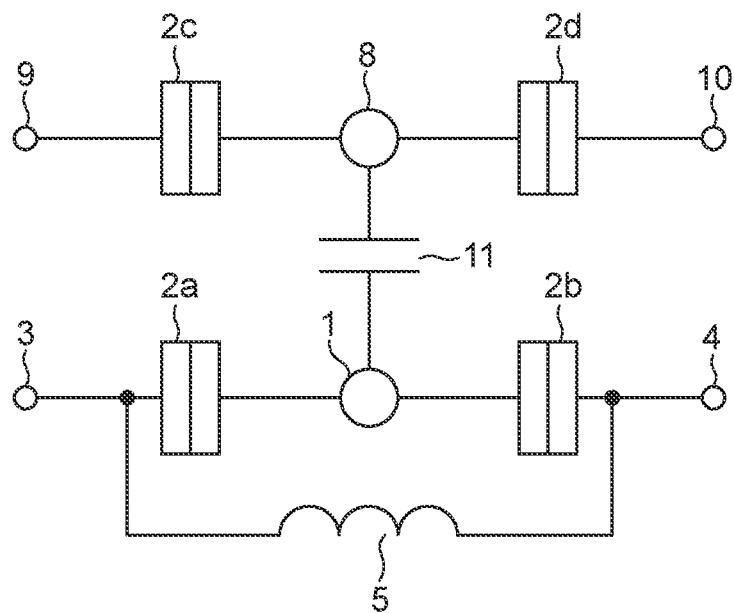
FIG. 4 is a second circuit diagram illustrating the configuration of the charge sensor according to the first embodiment.

FIG. 4 is a second circuit diagram illustrating the configuration of the charge sensor according to the first embodiment. More specifically, FIG. 4 illustrates that charge is sensed using the charge sensor according to the first embodiment. The left end of a quantum dot 8 whose charge is to be observed in FIG. 4 is connected to an input terminal 9 via a tunnel junction 2c. In addition, the right end of the quantum dot 8 in FIG. 4 is connected to an output terminal 10 via a tunnel junction 2d. Furthermore, the lower end of the quantum dot 8 in FIG. 4 is connected to the quantum dot 1 of the charge sensor via a coupling capacitance 11.

With this configuration, the charge sensor according to the first embodiment can sense a change in the amount of charge of the quantum dot 8 to be observed by knowing the state of the quantum dot 1 of the charge sensor.

Figure 5:
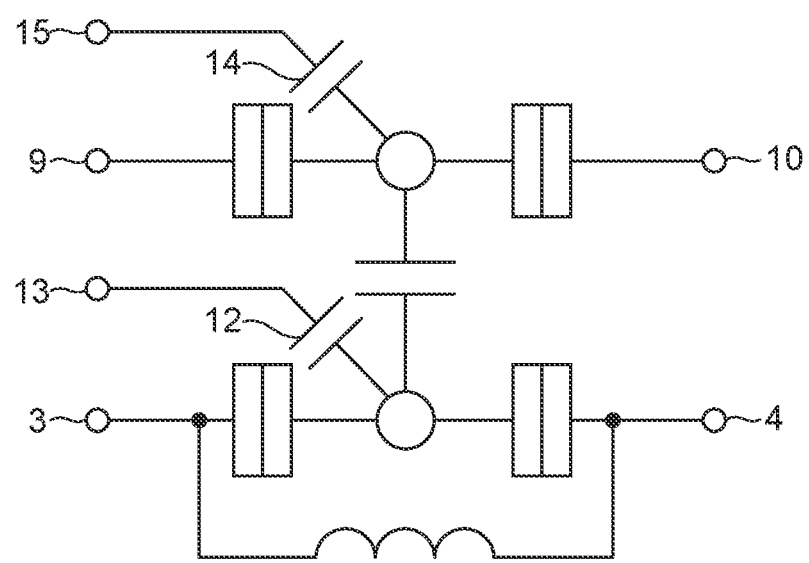
FIG. 5 is a third circuit diagram illustrating the configuration of the charge sensor according to the first embodiment.

FIG. 5 is a third circuit diagram illustrating the configuration of the charge sensor according to the first embodiment. As illustrated in FIG. 5, in addition to the configuration of the charge sensor illustrated in FIG. 4, the charge sensor according to the present disclosed technology may include a control terminal 13 and a control terminal 15. The quantum dot 1 of the charge sensor illustrated in FIG. 5 is connected to the control terminal 13 via a coupling capacitance 12. In addition, the quantum dot 8 to be observed is connected to the control terminal 15 via a coupling capacitance 14.

The control terminal 13 may be used to apply a DC voltage. Applying the DC voltage to the control terminal 13 acts on adjusting the potential of the quantum dot 1 of the charge sensor. The charge sensor according to the present disclosed technology can increase sensing sensitivity using the control terminal 13.

The control terminal 13 may be used to input an RF signal. In this case, the reflection amplitude and the reflection phase at the control terminal 13 may be used for sensing. In addition, the passing amplitude and the passing phase at the output terminal 4 may be used for sensing.

The control terminal 15 may be used to apply a DC voltage. Applying the DC voltage to the control terminal 15 acts on adjusting the potential of the quantum dot 8 to be observed. The charge sensor according to the present disclosed technology can increase the sensing sensitivity using the control terminal 15.

Figure 6:
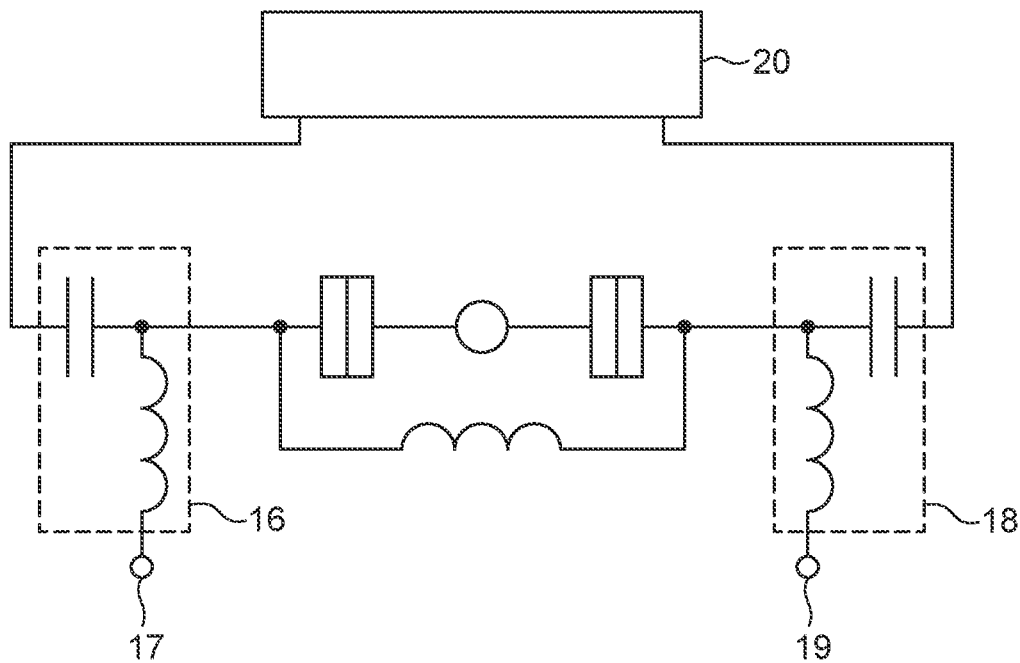
FIG. 6 is a fourth circuit diagram illustrating the configuration of the charge sensor according to the first embodiment.

FIG. 6 is a fourth circuit diagram illustrating the configuration of the charge sensor according to the first embodiment. More specifically, FIG. 6 illustrates a method of measuring the amount of charge using the charge sensor according to the first embodiment. In FIG. 6, the lower side indicates the side of an RF block. In FIG. 6, the upper side indicates the side of a DC block.

The charge sensor illustrated in FIG. 6 includes the configuration of the charge sensor illustrated in FIG. 1, and the input terminal 3 is connected to a bias tee 16. The bias tee 16 is a circuit portion surrounded by a dotted square on the left side of FIG. 6. The bias tee 16 is connected to a DC power supply terminal 17 on the side of the RF block, in addition, the bias tee 16 is connected to a network analyzer 20 on the side of the DC block. The bias tee 16 functions as a filter.

In the charge sensor illustrated in FIG. 6, the output terminal 4 is connected to a bias tee 18. The bias tee 18 is a circuit portion surrounded by a dotted square on the right side of FIG. 6. The bias tee 18 is connected to a DC power-supply terminal 19 on the side of the RF block. In addition, the bias tee 18 is connected to the network analyzer 20 on the side of the DC block. The bias tee 18 functions as a filter.

By adopting the configuration illustrated in FIG. 6, the charge sensor according to the first embodiment can separate a high-frequency signal from a DC bias in the signal at each of the input terminal 3 and the output terminal 4.

As described above, since the charge sensor according to the first embodiment has the above configuration, input and output characteristics change sharply with respect to the change in the capacitance value of the quantum dot 8 to be observed as compared with the conventional technique without the inductor 5. With this operation, the charge sensor according to the first embodiment can sense charge with high sensitivity as compared with the conventional technique without the inductor 5.

Second Embodiment

Figure 7:
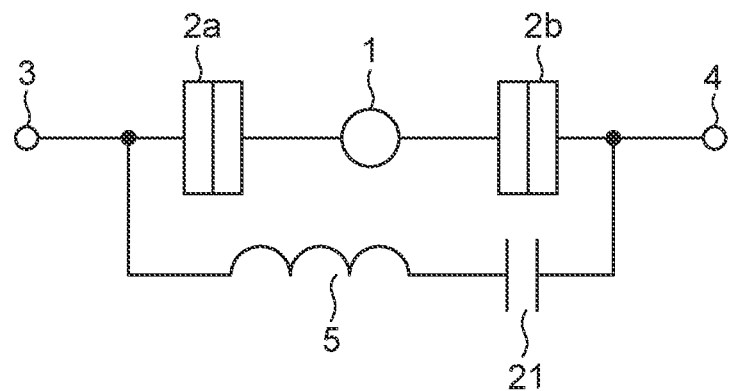
FIG. 7 is a circuit diagram illustrating a configuration of a charge sensor according to a second embodiment.

FIG. 7 is a circuit diagram illustrating a configuration of a charge sensor according to a second embodiment. In the charge sensor according to the second embodiment, in addition to the configuration of the first embodiment, a capacitor 21 is connected in series to the inductor 5. In general, when a current value flowing through the quantum dot 1 of the charge sensor is measured, the input terminal 3 and the output terminal 4 need to have different potentials. Since the capacitor 21 is connected in series to the inductor 5, the charge sensor according to the second embodiment acts in such a manner that the potentials of the input terminal 3 and the output terminal 4 do not become equal to each other easily.

As described above, since the charge sensor according to the second embodiment has the above configuration, in addition to the effects described in the first embodiment, it is possible to obtain the effect that the potentials of the input terminal 3 and the output terminal 4 do not become equal to each other easily.

Third Embodiment

Figure 8:
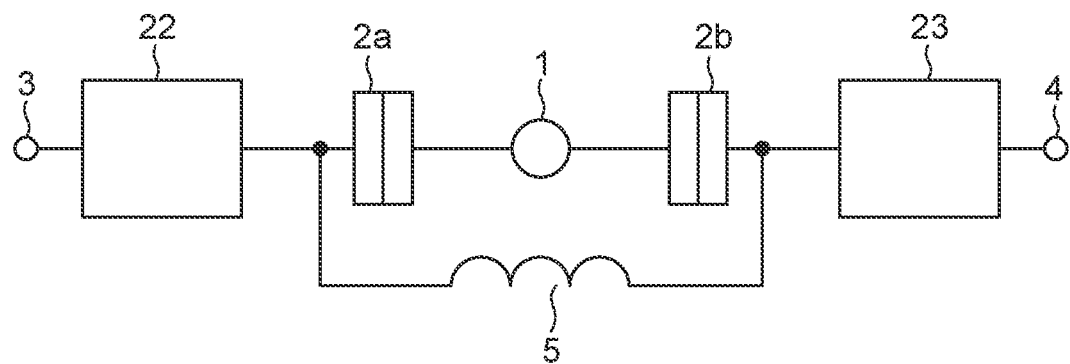
FIG. 8 is a circuit diagram illustrating a configuration of a charge sensor according to a third embodiment.

FIG. 8 is a circuit diagram illustrating a configuration of a charge sensor according to a third embodiment. As illustrated in FIG. 8, the charge sensor according to the third embodiment includes an input matching circuit 22 and an output matching circuit 23 in addition to the configuration of the first embodiment. The input matching circuit 22 is connected to the input terminal 3. The output matching circuit 23 is connected to the output terminal 4.

The input matching circuit 22 acts to match the impedance of the input terminal 3 with the input impedance of the charge sensor in an on state at the frequency of a high-frequency signal. Note that the impedance of the input terminal 3 is usually about 50 [$\Omega$].

The output matching circuit 23 acts to match the output impedance of the charge sensor with the impedance of the output terminal 4 at the frequency of the high-frequency signal. Note that the impedance of the output terminal 4 is usually about 50 [$\Omega$].

By adopting the configuration illustrated in FIG. 8, the charge sensor according to the third embodiment maximizes the passing amplitude and minimizes the reflection amplitude in the on state. The charge sensor according to the third embodiment improves the sensing sensitivity as compared with that with the configuration of the first embodiment by the action of the input matching circuit 22 and the output matching circuit 23.

Fourth Embodiment

Figure 9:
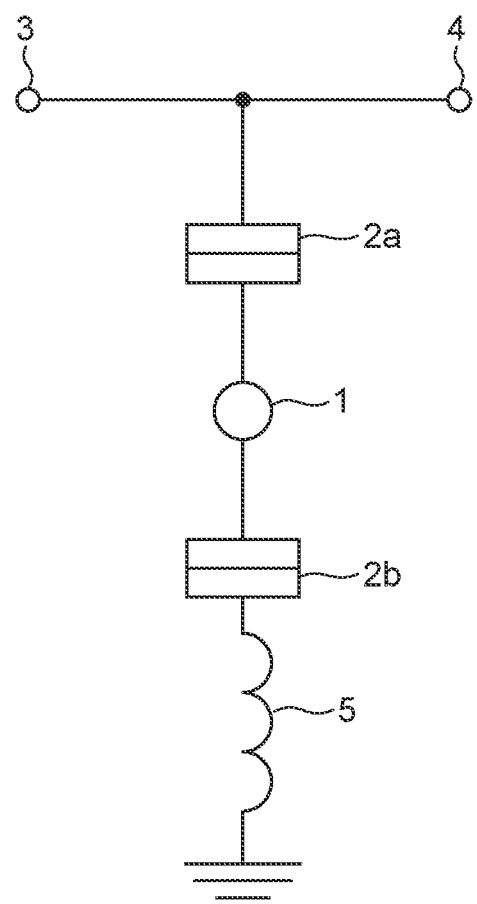
FIG. 9 is a circuit diagram illustrating a configuration of a charge sensor according to a fourth embodiment.

FIG. 9 is a circuit diagram illustrating a configuration of a charge sensor according to a fourth embodiment. The circuit configuration illustrated in FIG. 9 has a dual relationship with the circuit configuration of the charge sensor according to the first embodiment illustrated in FIG. 1. The charge sensor according to the present disclosed technology may adopt the circuit configuration illustrated in FIG. 9. In FIG. 9, there is no problem in that the input terminal 3 and the output terminal 4 have the same potential. It is desirable that a voltage is applied to a drain side, which is one end of the quantum dot 1, and a source side, which is the other end of the quantum dot 1, has a lower potential than the drain side. More specifically, in the charge sensor according to the fourth embodiment, the source side may be grounded.

From the viewpoint of DC, a current flows when the level of the quantum dot 1 is between the level of the drain and the level of the source, and no current flows when this condition is not satisfied. In this case, coulomb oscillation occurs in the quantum dot 1. When the quantum dot 1 undergoes such a change of state, the charge sensor according to the fourth embodiment can read the change of state with high sensitivity by performing high frequency measurement.

In the charge sensor illustrated in FIG. 9, the circuit in which the quantum dot 1 of the charge sensor and the inductor 5 are connected in series is shunt connected to the input terminal 3 and the output terminal 4. In the case of the circuit configuration illustrated in FIG. 9, the charge sensor resonates when the quantum dot 1 is in an off state, and the shunt connection portion seems to be short-circuited. In other words, since the quantum dot 1 looks like a capacitor in the off state, the circuit illustrated in FIG. 9 can be regarded that the series circuit of C and L is loaded on a shunt.

The impedance looking into the resonance circuit side from the point where the resonance circuit of C and L is shunt loaded can be represented by the following formula.

$$Z = j\omega L + \frac{1}{j\omega C} = \frac{j(1 - \omega^2 LC)}{\omega C} \quad (7)$$

At ω when the numerator is 0 on the right side of Equation (7), that is, when $\omega^2 = 1/CL$, the impedance Z on the left side of Formula (7) is 0, and the circuit illustrated in FIG. 9 is in a so-called total reflection state.

The charge sensor according to the fourth embodiment has the above configuration, and has a circuit configuration dual with the circuit configuration according to the first embodiment. Therefore, the charge sensor according to the fourth embodiment can also sense charge with high sensitivity as compared with the conventional technique without the inductor 5.

The charge sensor according to the present disclosed technology may use silicon quantum dots physically formed on an SOI substrate, but it is not limited thereto. In the charge sensor according to the present disclosed technology, quantum dots may be electrically formed using a fine gate in a two-dimensional electron gas of silicon. The charge sensor according to the present disclosed technology may use a substrate of gallium arsenide instead of silicon.

In the charge sensor according to the present disclosed technology, it is possible to freely combine the embodiments, modify any component of each embodiment, or omit any component of each embodiment within the scope of the creation of the technical idea.

As a modification of the charge sensor according to the present disclosed technology, it is also conceivable to short-circuit the output terminal 4 in the circuit configuration illustrated in FIG. 1. In this case, it is possible adopt a mode of use in which only reflection measurement from the input terminal 3 is performed without measuring passing characteristics.

As another modification of the charge sensor according to the present disclosed technology, it is also conceivable to open the output terminal 4 in the circuit configuration illustrated in FIG. 9, Also in this case, it is possible adopt the mode of use in which only reflection measurement from the input terminal 3 is performed without measuring passing characteristics.

INDUSTRIAL APPLICABILITY

The charge sensor according to the present disclosed technology can be applied to a quantum-gate quantum computer, and has industrial applicability.

REFERENCE SIGNS LIST

1: Quantum dot, 2 (2a, 2b, 2c, 2d): Tunnel junction, 3: Input terminal, 4: Output terminal, 5: inductor, 6: Equivalent off-capacitance, 7: Equivalent on-resistor, 8: Quantum dot, 9: Input terminal, 10: Output terminal, 11: Coupling capacitance, 12: Coupling capacitance, 13: Control terminal, 14: Coupling capacitance, 15: Control terminal, 16: Bias tee, 17: DC power-supply terminal, 18: Bias tee, 19: DC power-supply terminal, 20: Network analyzer, 21: Capacitor, 22: Input matching circuit, 23: Output matching circuit

The invention claimed is:

1. A charge sensor comprising:
a quantum dot having a first end connected to an input terminal via a first tunnel junction and a second end connected to an output terminal via a second tunnel junction; and
an inductor connected in parallel to the quantum dot.

2. The charge sensor according to claim 1, wherein
a resonance frequency calculated by an inductance of the inductor and an equivalent off-capacitance, when the quantum dot is in an off state, is equal to a frequency of a high-frequency signal input.

3. The charge sensor according to claim 2, further comprising a capacitor connected in series to the inductor.

4. The charge sensor according to claim 2 further comprising:
an input matching circuit to match an impedance of the input terminal with an input impedance in an on state at a frequency of the high-frequency signal; and an output matching circuit to match an output impedance with an impedance of the output terminal at a frequency of the high-frequency signal.

* * * * *